United States Patent
Copeland et al.

(10) Patent No.: US 6,542,724 B1
(45) Date of Patent: Apr. 1, 2003

(54) METHOD AND APPARATUS FOR PERFORMING IMAGE SIGNAL REJECTION

(75) Inventors: Miles A. Copeland, Ottawa (CA); Sorin Petre Voinigescu, Kanata (CA); David Marchesan, Ottawa (CA)

(73) Assignee: Nortel Networks Limited, St-Laurent (CA)

( * ) Notice: Subject to any disclaimer, the term of this patent is extended or adjusted under 35 U.S.C. 154(b) by 0 days.

(21) Appl. No.: 09/366,316

(22) Filed: Aug. 2, 1999

(51) Int. Cl.$^7$ ................................................ H04B 1/10
(52) U.S. Cl. ........................................ 455/302; 455/340
(58) Field of Search ................................. 455/302, 307, 455/339, 340, 266

(56) References Cited

U.S. PATENT DOCUMENTS

| | | | | |
|---|---|---|---|---|
| 4,523,184 A | * | 6/1985 | Abel | 340/531 |
| 5,371,476 A | * | 12/1994 | Brown | 330/254 |
| 5,613,234 A | * | 3/1997 | Vella-Coleicro | 455/340 |
| 5,883,539 A | * | 3/1999 | Kimura | 327/359 |
| 5,963,856 A | * | 10/1999 | Kim | 455/285 |
| 6,285,865 B1 | * | 9/2001 | Vorenkamp et al. | 327/554 |
| 6,327,463 B1 | * | 12/2001 | Welland | 331/36 C |
| 6,343,207 B1 | * | 1/2002 | Hessel et al. | 455/552 |

* cited by examiner

Primary Examiner—Vivian Chin
Assistant Examiner—Tu Nguyen

(57) ABSTRACT

A method and apparatus for performing image rejection filtering in a radio signal processing device. In a specific example of implementation, the apparatus is a radio transceiver that includes a transmitter and a receiver, each comprising an image rejection filter. A control signal, already available in the usual radio transceiver architecture, is used to simultaneously tune the LO frequency of the transceiver and the image rejection frequency of the image rejection filters. The image rejection filters are designed such that their image reject frequency accurately tracks the Local Oscillator (LO) frequency of the transceiver over a range of frequencies.

16 Claims, 5 Drawing Sheets

METHOD AND APPARATUS FOR PERFORMING IMAGE SIGNAL REJECTION

FIELD OF THE INVENTION

The present invention relates to signal processing, particularly in the fields of wireless ATM and fixed-radio access to the Internet. More specifically, it pertains to a method and apparatus for performing image signal rejection.

BACKGROUND OF THE INVENTION

Based on the proliferation of high-speed wireline Internet access at 2–10 Mb/s, it is obvious that there will be future demand for wireless access at comparable rates. Unlike the crowded 2 GHz band, the 5 GHz bands, with more than 300 MHz available, appear extremely attractive for high-speed applications such as wireless ATM and wideband fixed-radio access. In such applications, the design of a radio transceiver (transmitter and receiver) is critical to the successful realization of increased wireless access rates.

Standard practice in Radio Frequency (RF) receiver design has been to convert high frequency RF signals to one or more Intermediate Frequencies (IF) which, in a final translation step, are converted to baseband or Direct Current (DC). Such IF signals are by nature at a lower frequency than the RF signals. The opposite conversion is effected at the transmitter. Each translation stage normally uses a mixer and an image rejection filter, where each mixing operation produces both the desired signal and an image signal. The image signal falls into the same IF frequency band as the desired signal and corrupts it, and must be filtered out. An Image Rejection Filter (IRF) is thus required in order to suppress the image signal.

In existing radio transceivers that are implemented on a chip, off-chip fixed filters are used to achieve image signal rejection. Unfortunately, such filters require additional pins and interfaces, thus increasing power requirements, package complexity and cost. Although tunable on-chip bandpass filters have been considered, they have generally been found to be unfeasible as it is very difficult to obtain stability and accuracy in the tune frequency.

In an alternative, image reject mixers have been used in prior art designs, whereby two mixers are driven by Local Oscillator (LO) voltages shifted by 90 degrees, capable to selectively favor the desired RF signal over the image signal. In practice, these image reject mixers are capable of a certain amount of image rejection, however it is generally limited to less than −40 dB. Moreover, such image reject mixers require extra circuitry, resulting in increased power consumption, noise and chip area.

The background information provided above shows that there exists a need in the industry to provide an improved method and apparatus for performing image signal rejection.

SUMMARY OF THE INVENTION

The present invention is directed to a method and apparatus for achieving tunable image signal rejection in a radio signal processing device. The radio signal processing device includes a tunable local oscillator to generate a frequency signal at a selected frequency within a certain frequency range, and a receiver for receiving an RF signal, where the receiver itself includes a mixer and a filter. The mixer is responsible for converting the RF signal to an IF signal. The filter is coupled to the mixer for performing image signal rejection at an image reject frequency, and is designed to alter the image reject frequency such that the image reject frequency tracks the local oscillator frequency.

By incorporating the image rejection filter into the receiver such that the device can be implemented on a single chip, and by ensuring that the image reject frequency of the filter tracks the local oscillator frequency, stable on-chip tuning of the image rejection filter can be achieved. The stability of this design provides an important advantage over prior art designs of on-chip image reject filters, in which it is difficult to achieve stability and accuracy. Further advantages include a considerable cost saving and a reduction in the chip area.

In a specific example of implementation, the radio signal processing device includes a frequency control unit. This frequency control unit generates a control signal for tuning the local oscillator to a particular frequency. Specific to the present invention, the control signal is used to simultaneously tune both the local oscillator and the receiver filter to their respective frequency of operation.

In another example of implementation, the radio signal processing device is a radio transceiver which additionally includes a transmitter for transmitting an RF signal. The transmitter includes a power amplifier, an amplifier driver, a mixer and a filter. The mixer is responsible for converting an IF signal to an RF signal. The filter is coupled to the amplifier driver for performing image signal rejection at an image reject frequency, and is designed to alter the image reject frequency such that the image reject frequency tracks the local oscillator frequency. The control signal generated by the frequency control unit is used to simultaneously tune the local oscillator, the receiver filter and the transmitter filter to their respective frequency of operation.

The present invention also provides a mixer and filter combination for achieving image signal rejection.

The present invention also relates to a method for rejecting an image signal resulting from the conversion of an RF signal to an IF signal in a radio signal processing device.

Other aspects and features of the present invention will become apparent to those ordinarily skilled in the art upon review of the following description of specific embodiments of the invention in conjunction with the accompanying figures.

DESCRIPTION OF THE PREFERRED EMBODIMENTS

Figure 1:
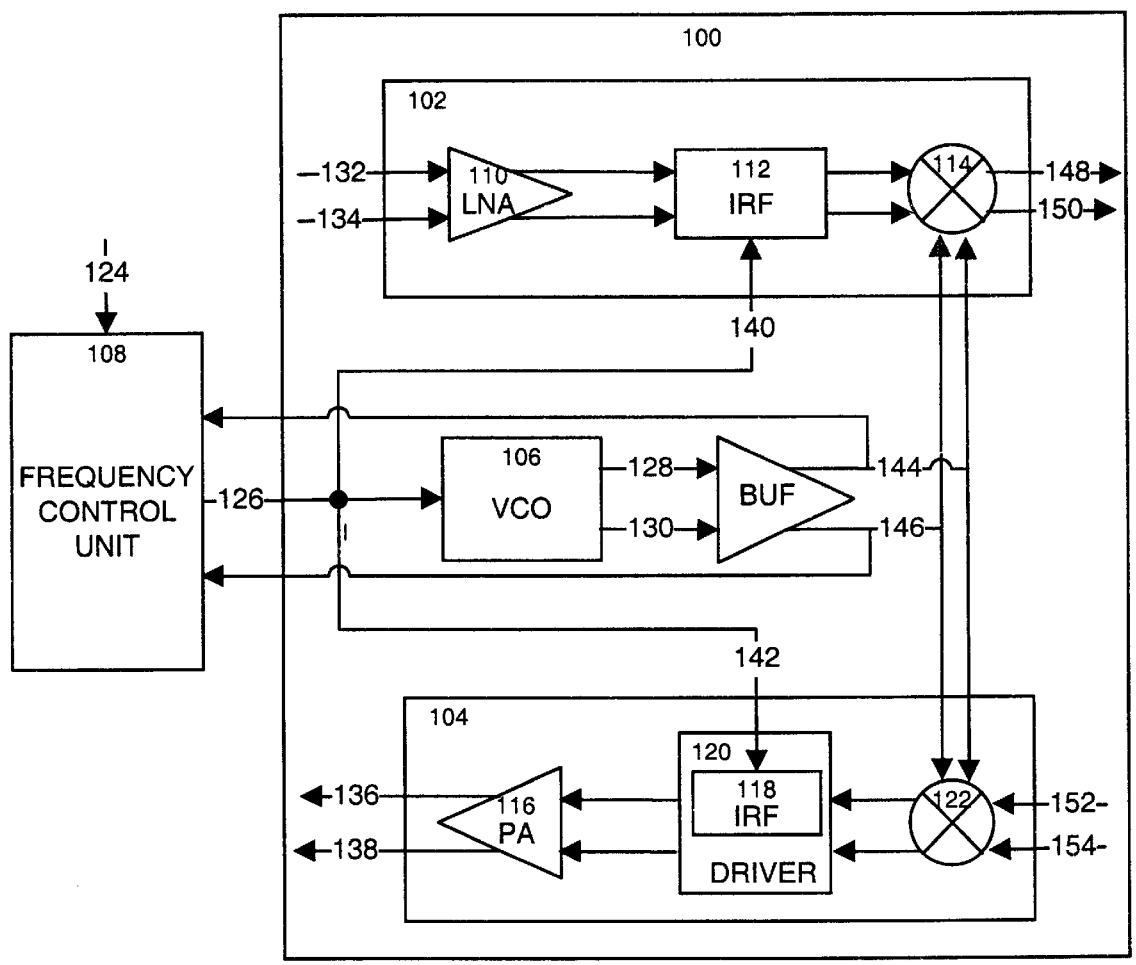
FIG. 1 is a system-level block diagram of a radio transceiver, in accordance with an embodiment of the present invention.

FIG. 1 is a system-level diagram of a specific example of implementation of a radio signal processing device, in accordance with the present invention. Specifically, this radio signal processing device is a radio transceiver, for receiving and transmitting RF signals from and to remote devices. The transceiver 100 includes primarily a receiver 102, a transmitter 104 and a shared Voltage-Controlled Oscillator (VCO) 106. Image Reject Filters (IRF) 112 and 118 are integrated into the receiver 102 and the transmitter 104, respectively. An external frequency control unit 108 is coupled to the VCO 106, responsible for generating and providing to the VCO 106 a control voltage $V_{freq}$ at output 126. Alternatively, the frequency control unit 108 may be implemented as an integral component of the transceiver 100. Differential transmission lines 144, 146 convey the Local Oscillator (LO) signal, output by the VCO 106, to mixer 114 of the receiver 102 and to mixer 122 of the transmitter 104. Mixer 114 is responsible for converting RF signals to lower frequency IF signals, while mixer 122 is responsible for converting IF signals to higher frequency RF signals. In a particular example, the radio transceiver 100 chip is fabricated by IBM using a technology known as SiGe HBT. This is only an example of implementation as other possibilities also exist. Note that the architecture of the transceiver 100 is fully differential in order to reduce common-mode (even harmonic) effects, minimize on-chic cross-talk and reduce the impact of ground inductance.

The receiver 102 also includes a Low-Noise Amplifier (LNA) 110. Incoming RF signals arriving at the receiver 102 over differential transmission lines 132, 134 are input to the LNA 110, which drives the mixer 114. The IRF 112 is integrated into the structure of the receiver 102, as will be described in further detail below.

Similarly, the transmitter 104 also includes a linear Power Amplifier (PA) 116. The IRF 118 is integrated into the structure of the transmitter 102 by connection to an amplifier driver 120, as will be described in further detail below. Outgoing RF signals are output from the PA 116 of the transmitter 104 over differential transmission lines 136, 138.

The frequency control unit 108 includes a feedback loop, or Phase-Locked Loop (PLL), that automatically develops a low-frequency control voltage for the VCO 106, specifically $V_{freq}$ 126. The frequency control unit 108 is digitally set by a Digital Frequency Control (DFC) signal 124. Thus, the DFC signal 124 determines the control voltage $V_{freq}$ output by the frequency control unit 108, which itself sets the LO frequency in the VCO 106. The VCO 106 is designed such that the LO frequency is variable over a certain frequency range, where the particular LO frequency at which the VCO 106 operates at any given time is determined by the control voltage $V_{freq}$ 126. In a specific example, this frequency range is 350 MHz. The structure and functionality of such a frequency control unit is well known to those skilled in the art and will not be described in further detail.

As is well known in he field of image rejection filters, in order for an IRF to accomplish its task of rejecting the image signal, this IRF must act at a frequency on one side of the LO frequency of the transceiver which directly mirrors the desired signal frequency on the other side of the LO frequency. Consequently, where the desired signal frequency is tunable over a range of frequencies, the IRF must be tunable over a mirror range of frequencies on the other side of the LO frequency.

As shown in FIG. 1, IRF 112 and IRF 118 both receive the control voltage $V_{freq}$ 126, specifically at inputs 140 and 142, respectively. Consequently, as the LO frequency of the VCO 106 is digitally set by the frequency control unit 108 via control voltage $V_{freq}$ 126, the IRFs 112 and 118 are simultaneously tuned to an image reject frequency by the control voltage $V_{freq}$ 126. As the LO frequency of the VCO 106 varies with respect to the control voltage $V_{freq}$ 126, the image reject frequency automatically tracks the LO frequency so as to maintain a fixed frequency separation between the LO frequency and the image reject frequency. Thus, a fixed IF frequency is maintained in the transceiver 100 and automatic tuning of the image reject frequency in the radio transceiver 100 is obtained using a tuning voltage ($V_{freq}$) that is already available within the transceiver 100 for other purposes.

The tracking of the VCO 106 LO frequency by the image reject frequency of the IRFs 112 and 118 is ensured by the structural design of the IRFs 112 and 118. Specifically, IRF 112 and IRF 118 are designed such that they have a center frequency (image reject frequency) one IF frequency offset from the LO frequency of the VCO 106, on the opposite side of the LO frequency from the desired RF signal. Thus the value of the IF frequency corresponds to the frequency separation between the image reject frequency and the LO frequency. The structural implementation of the IRFs 112, 118 will be described in further detail below.

In a specific embodiment of the present invention, the IRFs 112, 118 are designed to track the VCO 106 by using the same resonant tank structure for all three components, including similar inductor designs and capacitor structures. Specifically, each of the VCO 106, the IRF 112 and the IRF 118 includes a resonator, for establishing a frequency within the particular component. This frequency is the LO frequency in the VCO 106, and the image reject frequency in the IRFs 112 and 118. The same basic circuit topology is employed for all three resonators, as will be described in further detail below. Since the resonators of IRF 112, IRF 118 and VCO 106 match and all three components are tuned simultaneously by the control voltage $V_{freq}$ 126, as the LO frequency is set in the VCO 106, the image rejection frequency in the IRFs 112, 118 automatically tracks the LO frequency, and thus the desired RF frequency.

Figure 2:
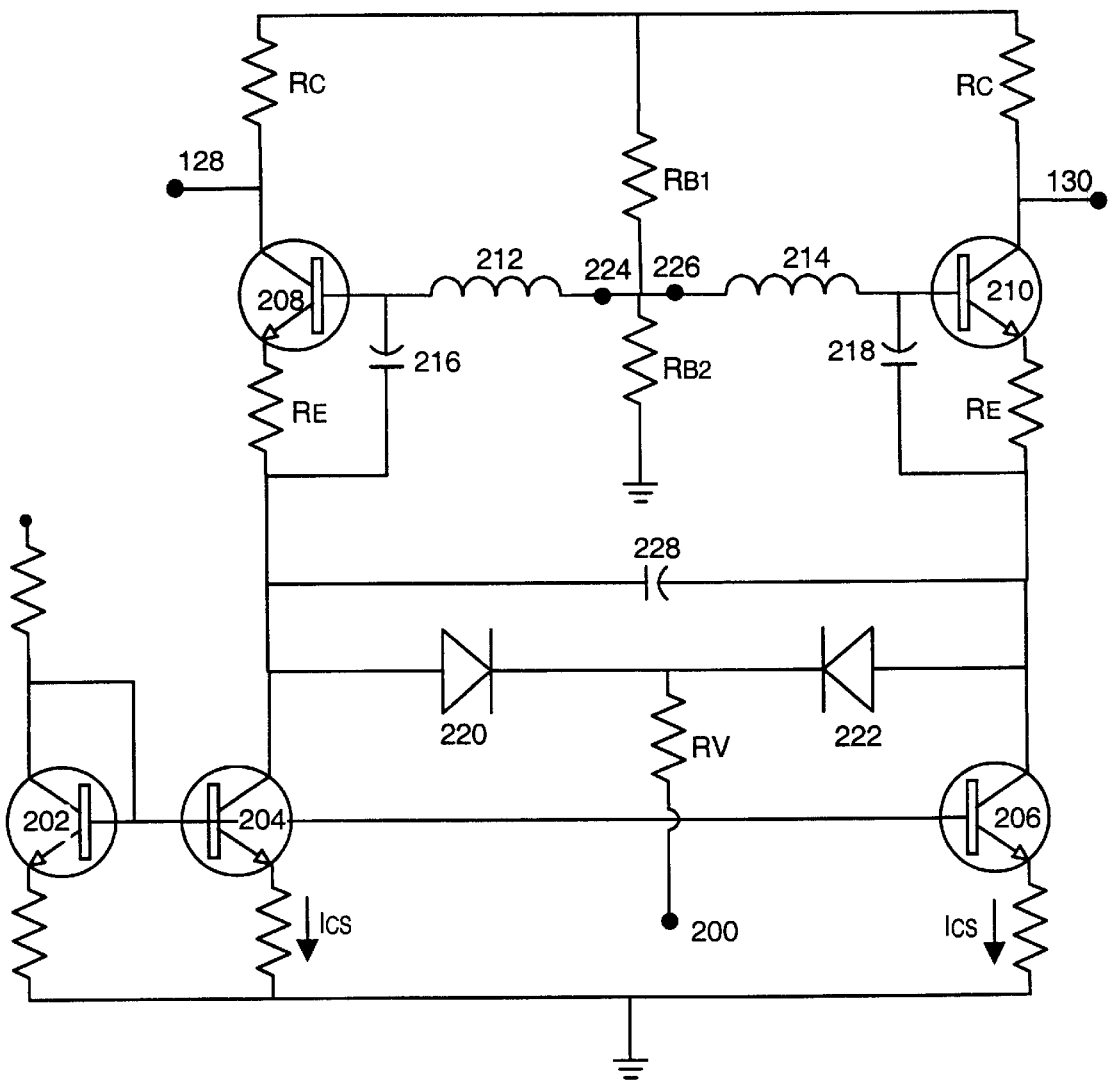
FIG. 2 is a circuit diagram of the Voltage-Controlled Oscillator (VCO) shown in FIG. 1.

In a particular example of implementation, the VCO 106 has a circuit topology as shown in FIG. 2, specifically a differential LC-varactor resonant circuit architecture. Note that the term "varactor" refers to a semi-conductor device having a varying reactance. At node 200 the control voltage $V_{freq}$ is input to the VCO 106. A current mirror formed of BJT transistors 202, 204 and 206 generates the bias current $I_{cs}$ of the BJT pair 208, 210. The latter, along with inductors 212, 214, capacitors 216, 218, 228 and varactor diodes 220, 222 form an LC-tuned Colpitts oscillator, for generating the frequency of oscillation of the VCO 106 (LO frequency). The differential LO signal generated by the VCO 106 is output at nodes 128, 130. In the case of a Colpitts oscillator, the oscillator oscillates because capacitance from emitter to ground of the BJTs 208, 210 appears as negative resistance to base currents. Note that many different oscillator configurations exist and may be used to implement the VCO 106.

With respect to IRFs 112, 118, assume that a notch filter approach is used. Alternatively, a bandpass filter approach may be taken. These different types of filters will not be described in further detail, as they are well known to those skilled in the art and have been well documented. Continuing with the above example of implementation, a similar LC-varactor resonant circuit architecture as in the VCO 106 of FIG. 2 is used for the IRFs 112, 118. However, the ends of inductors 212, 214, notably nodes 224 and 226, respectively, are disconnected and instead connected differentially inside stages of the receiver 102 (in the case of the IRF 112) and the transmitter 104 (in the case of the IRF 118). This follows from the basic IRF principle, which is to form a differential series resonator with negative resistance control such that nodes 224, 226 looking into the inductors 212, 214 exhibit zero resistance at series resonance. These nodes are then connected to other circuits (with the receiver 102 or transmitter 104) so as to shunt current to ground at the desired image reject frequency.

Figure 3:
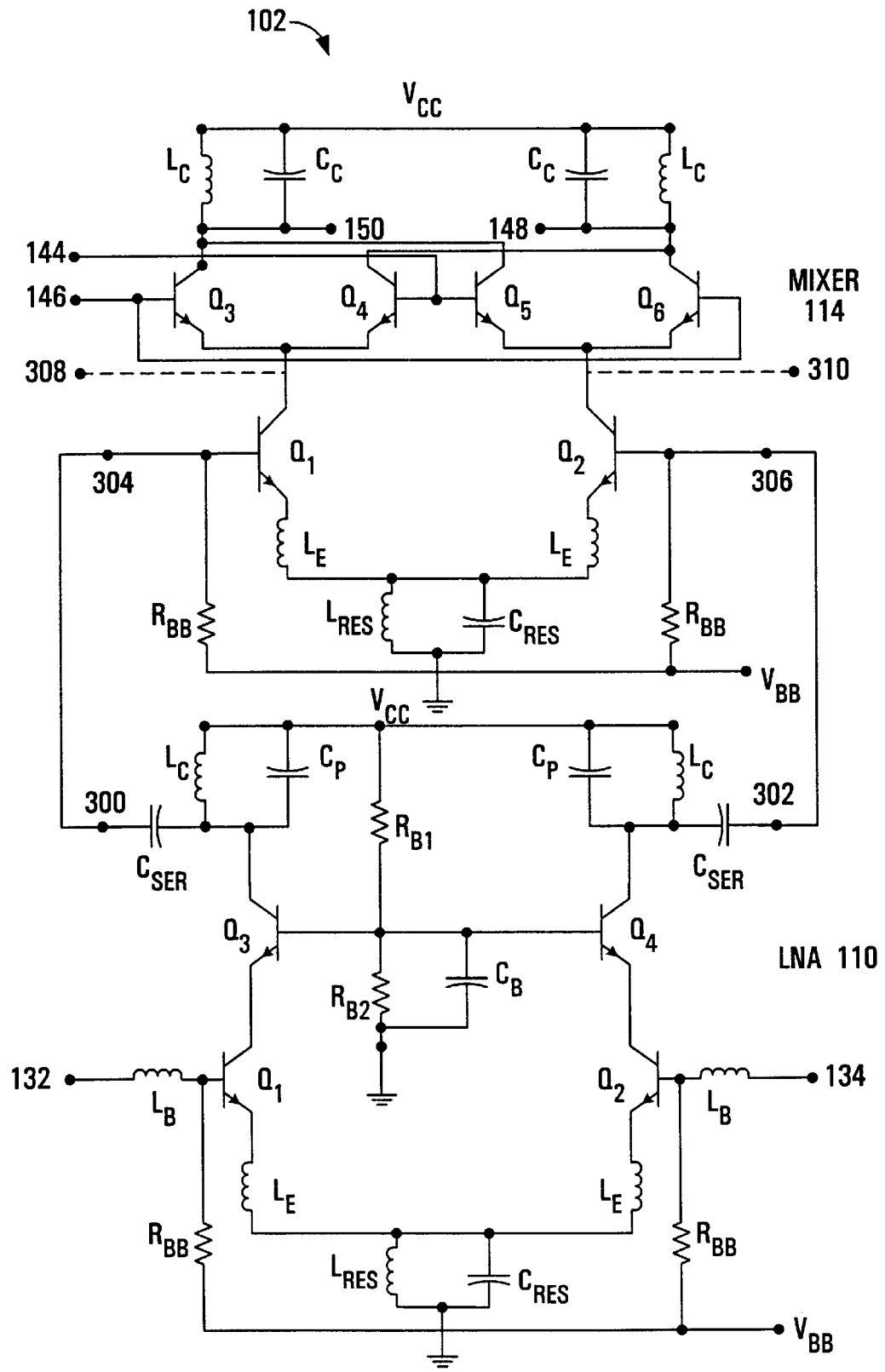
FIG. 3 is a circuit diagram of the radio receiver shown in FIG. 1.

FIG. 3 is a circuit diagram representative of an example of implementation of the receiver 102, including the LNA 110 and the mixer 114. An incoming RF signal is input to the LNA 110 at differential inputs 132, 134, and output after amplification at differential outputs 300, 302. This signal then drives the mixer 114 at differential inputs 304, 306. The LO signal from the VCO 106 is input to the mixer 114 at differential inputs 144, 146. Nodes 308, 310 are the connection points at which the IRF 112 is integrated into the receiver 102, for effecting image signal rejection. Assuming that the circuit architecture shown in FIG. 2 corresponds to that of IRF 112, nodes 308, 310 of the receiver 102 correspond to the differential connection points for nodes 224, 226, respectively, of IRF 112. As described above, the IRF 112 provides a short circuit to ground for image frequency currents. Specific to this example, the mixer 114 is a Gilbert cell mixer quad, where the IRF 112 is connected at the emitters of the four BJTs, also referred to as emitter bridge diodes. The mixer 114 outputs an IF signal at differential outputs 148, 150.

Figure 4A:
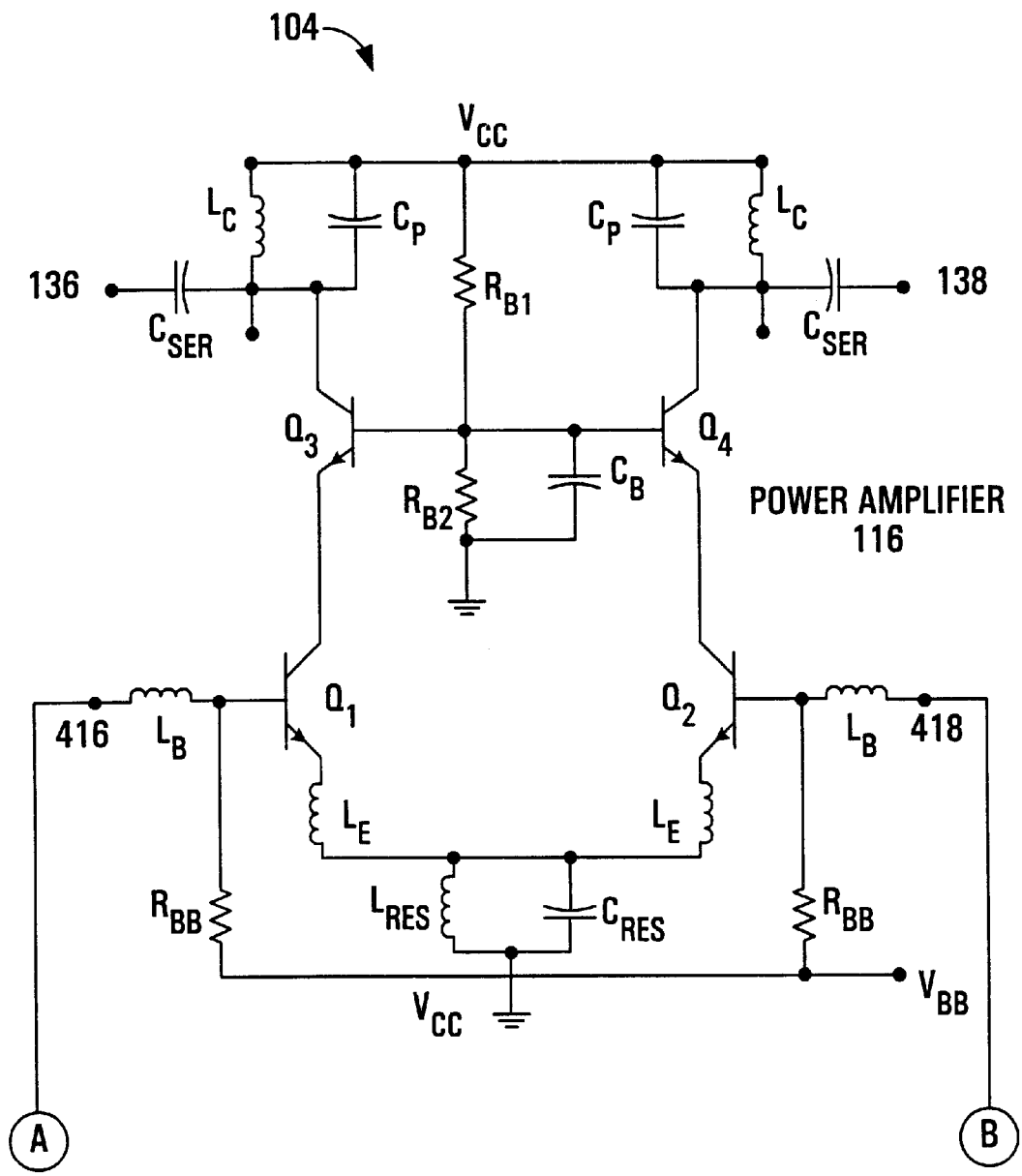
FIG. 4 is a circuit diagram of the radio transmitter shown in FIG. 1.
Figure 4B:
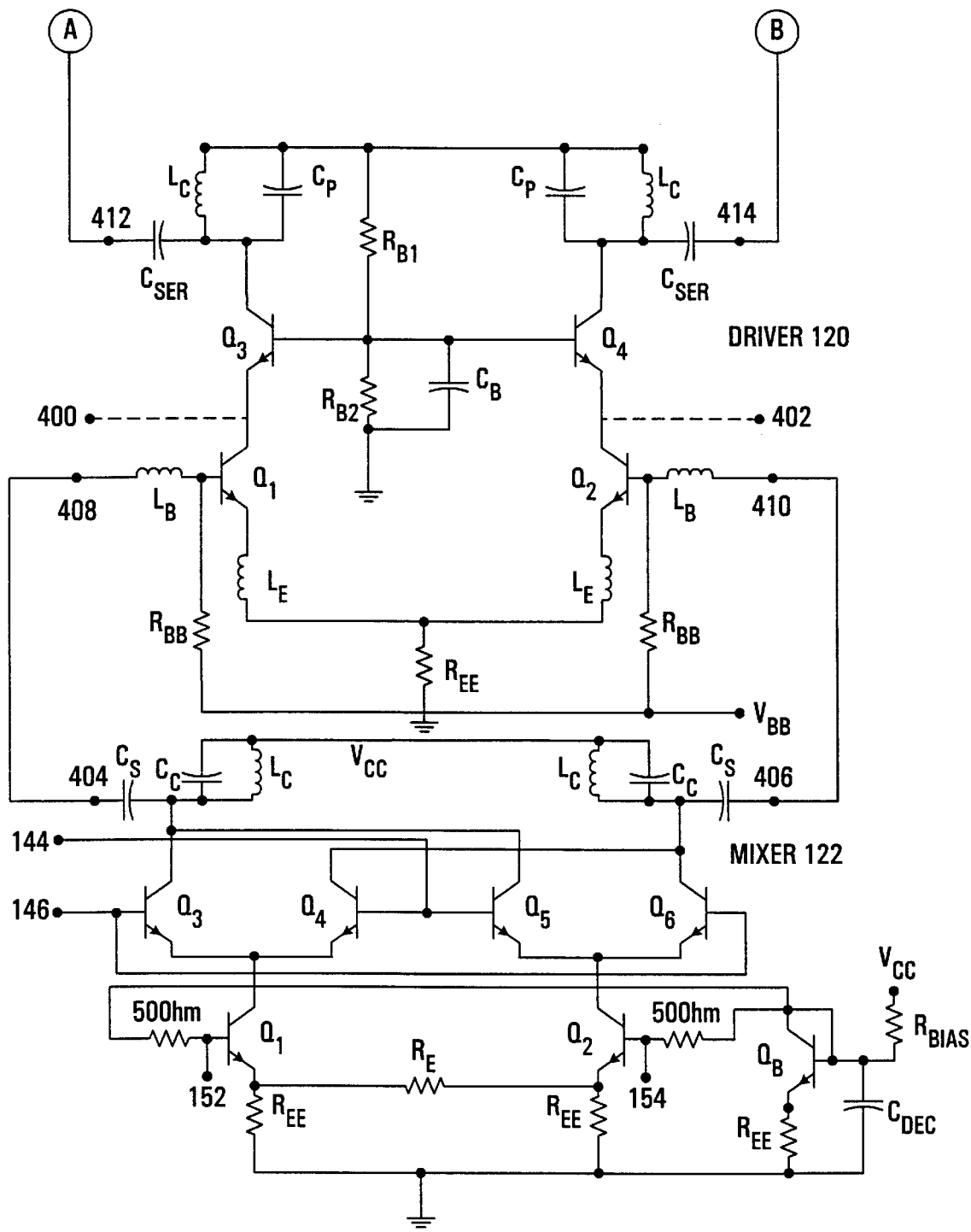

FIGS. 4A and 4B show a circuit diagram representative of an example of implementation of the transmitter 104, including the power amplifier 116, the amplifier driver 120 and the mixer 122. An IF signal is input to the mixer at differential inputs 152, 154. The LO signal from the VCO 106 is input to the mixer at differential inputs 144, 146. An RF signal is output from the mixer at differential outputs 404, 406 and input to the amplifier driver 120 at differential inputs 408, 410. The IRF 118 is connected to the amplifier driver 120 at nodes 400, 402, specifically at the emitters of the common-base BJT pair of the amplifier driver 120. Assuming now that the circuit architecture shown in FIG. 2 corresponds to that of IRF 118, nodes 400, 402 of the transmitter 104 correspond to the differential connection points for nodes 224, 226, respectively, of IRF 118. As described above, the IRF 118 provides a short circuit to ground for image frequency currents, and is used to attenuate the image signal caused by the mixing of the transmit IF signal and the LO signal. The amplifier driver 120 outputs the signal at differential outputs 412, 414, which drives the power amplifier 116 at differential inputs 416, 418. The power amplifier itself outputs the amplified signal from the transmitter 104 at differential outputs 136, 138.

The structure and functionality of the various components of the receiver 102 and the transmitter 104 will not be described in further detail, as they are well known to those skilled in the art and are not critical to the success of the present invention.

In the particular example of implementation described above, the tunable IRF 112 is integrated into the receiver 102. Specifically, the IRF 112 is incorporated contiguously within the mixer 114, forming a tunable image reject mixer, where the IRF 112 consists in a tunable LC series resonance placed at the emitters of the mixer 114 bridge network that does the actual mixing. Such a filter implementation affords an important improvement in linearity/noise trade-off with respect to prior art designs in which an additional amplifier stage is needed between the LNA 110 and the mixer 114 to provide an insertion point for the IRF 112. The additional amplifier stage leads to an unfavorable linearity/noise figure trade-off because of the extra gain. Given the more direct connection of the LNA 110 and mixer 114 combination shown in FIG. 2, the result is that there is sufficient gain up to the point of connection that the LNA 110 may drive the RF signal into the mixer 114 in a conventional fashion, and a favorable balance between gain and noise figure is possible.

Note that the above-described mixer and image reject filter combination (tunable image reject mixer) may be used in different circuits to perform image signal rejection, independent from the above-described radio transceiver implementation. Such a tunable image reject mixer affords important advantages over prior art designs, specifically a decrease in power consumption, noise and chip area.

The performance of the above-described example of implementation of a radio transceiver 100 has been simulated and measured in a laboratory. The results reveal that the present invention allows for monolithic tracking of the image reject filters 112, 118 on the transceiver 100, such that more than 40 dB of image rejection, tunable over 350 MHz, is achieved on-chip over a 20 MHz-wide channel. Accurate tracking is achieved whereby the notch frequency of IRFs 112, 118 is kept well centered in order to automatically reject the image signal frequency as the transmitter 104 and receiver 102 RF frequency is changed. Representative frequencies for the receiver 102 and transmitter 104 shown in FIG. 3 are: RF=5 GHz; LO frequency=4 GHz; image reject frequency=3 GHz, for IF=1 GHz.

Note that in an alternative embodiment of the present invention, the radio signal processing device 100 may include only one of the receiver 102 and the transmitter 104. Specifically, the radio signal processing device 100 may be operative to receive but not transmit RF signals (receiver 102 only), or it may be operative to transmit but not receive RF signals (transmitter 104 only). In either situation, tracking of the VCO 106 LO frequency by the image reject frequency of the IRF (112 in receiver 102 or 118 in transmitter 104) is implemented as described above, such that tunable image signal rejection is achieved in the radio signal processing device.

The above description of a preferred embodiment under the present invention should not be read in a limitative manner as refinements and variations are possible without departing from the spirit of the invention. The scope of the invention is defined in the appended claims and their equivalents.

We claim:

1. A radio signal processing device comprising:
  a tunable local oscillator to generate a signal at a selected frequency within a certain frequency range, the selected frequency being a first frequency;
  a transmitter, including:
    a) an input for receiving an IF signal;
    b) a power amplifier having an output for releasing an amplified RF signal from said transmitter;
    c) a mixer for converting the IF signal received at said input to a control RF signal;
    d) an amplifier driver coupled to said mixer for receiving the control RF signal from said mixer, said amplifier driver operative to drive said power amplifier such that said power amplifier generates the amplified RF signal;
    e) a filter coupled to said amplifier driver for performing image signal rejection at a second frequency, said filter operative to alter the second frequency such that the second frequency tracks the first frequency.

2. A radio signal processing device as defined in claim 1, said filter operative to alter the second frequency such that said second frequency tracks the first frequency in a way to maintain a substantially constant frequency separation between the first frequency and the second frequency.

3. A radio signal processing device as defined in claim 2, wherein the frequency separation between the second frequency and the first frequency is equivalent to the IF frequency.

4. A radio signal processing device as defined in claim 1, wherein said radio signal processing device further includes a frequency control unit for generating a control signal, said local oscillator and said filter being responsive to the control signal to set the first and second frequencies respectively to particular values.

5. A radio signal processing device as defined in claim 1, wherein said local oscillator includes a resonant tank structure.

6. A radio signal processing device as defined in claim 1, wherein said mixer is a Gilbert cell mixer quad.

7. A radio signal processing device as defined in claim 6, wherein said amplifier driver includes a pair of bipolar junction transistors, each transistor having an emitter, said filter being connected at the emitters of the transistor pair.

8. A radio signal processing device as defined in claim 1, wherein said filter is a notch filter.

9. A radio signal processing device as defined in claim 1, wherein said filter is a bandpass filter.

10. A radio signal processing device as defined in claim 1, wherein said frequency range is 350 MHz.

11. A radio signal processing device comprising:
   a tunable local oscillator to generate a signal at a selected frequency within a certain frequency range, the selected frequency being a first frequency;
   a receiver, including:
      a) a first input for receiving an RF signal;
      b) a first output for releasing an IF signal;
      c) a first mixer for converting the RE signal received at said first input to an IF signal;
      d) a first filter coupled to said first mixer for performing image signal rejection at a second frequency, said first filter operative to alter the second frequency such that the second frequency tracks the first frequency;
   a transmitter, including:
      a) a second input for receiving an IF signal;
      b) a power amplifier having a second output for releasing an amplified RF signal from said transmitter;
      c) a second mixer for converting the IF signal received at said second input to a control RF signal;
      d) an amplifier driver coupled to said second mixer for receiving the control RF signal from said second mixer, said amplifier driver operative to drive said power amplifier such that said power amplifier generates the amplified RF signal;
      e) a second filter coupled to said amplifier driver for performing image signal rejection at a third frequency, said second filter operative to alter the third frequency such that the third frequency tracks the first frequency.

12. A signal processing device as defined in claim 11, wherein the third frequency and the second frequency are substantially the same.

13. A radio signal processing device as defined in claim 12, wherein said local oscillator is characterized by a fix resonant circuit architecture, each of said first and second filters being characterized by a second resonant circuit architecture substantially identical to the first resonant circuit architecture of said local oscillator.

14. A radio signal prosing device as defined in claim 13, wherein each of said local oscillator, said first filter and said second filter includes a resonant tank structure.

15. A radio signal processing device as defined in claim 14, wherein the resonant tank structure of each of said local oscillator, said first filter and said second filter is a differential LC circuit having a varying reactance.

16. A radio signal processing device comprising:
   tunable oscillator means for generating a signal at a selected frequency within a certain frequency range, the selected frequency being a first frequency;
   transmitter means, including:
      a) input means for receiving an IF signal;
      b) power amplifier means for releasing an amplified RF signal from said transmitter means;
      c) mixer means for converting the IF signal received at said input means to a control RF signal;
      d) amplifier driver means coupled to said mixer means for receiving the control RF signal from said mixer means, said amplifier driver means operative to drive said power amplifier means such that said power amplifier means generates the amplified RF signal;
      e) filter means coupled to said amplifier driver means for performing image signal rejection at a second frequency, said filter means operative to alter the second frequency such that the second frequency tracks the first frequency.

* * * * *